United States Patent
Zhang et al.

(10) Patent No.: US 8,466,077 B2
(45) Date of Patent: Jun. 18, 2013

(54) SPUTTERING TARGET FOR FORMING ZRO$_2$-IN$_2$O$_3$ BASED PROTECTIVE FILM FOR OPTICAL STORAGE MEDIUM

(75) Inventors: Shoubin Zhang, Sanda (JP); Akifumi Mishima, Saitama (JP)

(73) Assignee: Mitsubishi Material Corporation, Tokyo (JP)

( * ) Notice: Subject to any disclaimer, the term of this patent is extended or adjusted under 35 U.S.C. 154(b) by 766 days.

(21) Appl. No.: 12/733,429

(22) PCT Filed: Sep. 5, 2008

(86) PCT No.: PCT/JP2008/066126
§ 371 (c)(1), (2), (4) Date: Mar. 1, 2010

(87) PCT Pub. No.: WO2009/031670
PCT Pub. Date: Mar. 12, 2009

(65) Prior Publication Data
US 2010/0206725 A1   Aug. 19, 2010

(30) Foreign Application Priority Data
Sep. 6, 2007   (JP) ................................ 2007-231670

(51) Int. Cl.
*C04B 35/486*   (2006.01)

(52) U.S. Cl.
USPC .... 501/103; 501/105; 204/298.13; 252/520.1

(58) Field of Classification Search
USPC ........... 501/103, 105; 204/298.13; 252/520.2, 252/520.21, 520.22
See application file for complete search history.

(56) References Cited

U.S. PATENT DOCUMENTS

| | | |
|---|---|---|
| 2005/0019695 A1 | 1/2005 | Kojima et al. |
| 2005/0207331 A1 | 9/2005 | Shinkai et al. |
| 2012/0043509 A1* | 2/2012 | Takami et al. ................ 252/512 |

FOREIGN PATENT DOCUMENTS

| | | | |
|---|---|---|---|
| EP | 1211679 | * | 6/2002 |
| JP | 2000195101 | * | 7/2000 |
| JP | 2005-056545 A | | 3/2005 |
| JP | 2005-267779 A | | 9/2005 |
| JP | 2006213964 | * | 8/2006 |
| WO | WO-2007/063687 A1 | | 6/2007 |

OTHER PUBLICATIONS

International Search Report dated Sep. 30, 2008, issued on PCT/JP2008/066126.

* cited by examiner

*Primary Examiner* — Karl Group
(74) *Attorney, Agent, or Firm* — Edwards Wildman Palmer LLP

(57) ABSTRACT

A sputtering target for forming a ZrO$_2$—In$_2$O$_3$ based protective film for an optical storage medium, has a component composition made of $Zr_a In_b A_c O_{100-a-b-c}$ where "A" represents one, two, or more of Si, Cr, Al, Ce, Ti, and Sn, "a" represents an amount greater than 5 atomic percent and less than 23 atomic percent, "b" represents an amount greater than 12 atomic percent and less than 35 atomic percent, and "c" represents an amount greater than 0 and less than 30 atomic percent, wherein 90% or more of Zr that is included in the sputtering target for forming the protective film for the optical storage medium is in an oxidative product phase in which Zr and In are combined, and is dispersed in a base material of the target.

2 Claims, No Drawings

SPUTTERING TARGET FOR FORMING ZRO₂-IN₂O₃ BASED PROTECTIVE FILM FOR OPTICAL STORAGE MEDIUM

BACKGROUND OF THE INVENTION

1. Field of the Invention

The present invention relates to a sputtering target (hereinafter, it will be referred to as a target) having excellent resistance to cracking, used for forming a $ZrO_2$—$In_2O_3$ based protective film for an optical storage medium, the optical storage medium being capable of recording, playing, both of recording and playing, or deleting information using a laser light.

This application claims priority from Japanese Patent Application No. 2007-231670 filed on Sep. 6, 2007, the contents of which are incorporated herein by reference in their entirety.

2. Background Art

Generally, a ZnS—$SiO_2$ based protective film has been known as a typical protective film (the protective film includes a lower section protective film and an upper section protective film) constituting an optical storage medium such as an optical disc. The ZnS—$SiO_2$ based protective film has component compositions including 20% of silicon dioxide ($SiO_2$) and the rest thereof constituted of zinc sulfide (ZnS).

It is known that the ZnS—$SiO_2$ based protective film having the foregoing component compositions are obtained by sputtering, by use of a ZnS—$SiO_2$ based target made of a hot-pressed sintered body including 20% of silicon dioxide ($SiO_2$) and the rest thereof constituted of zinc sulfide (ZnS).

However, in the ZnS—$SiO_2$ based protective film that is obtained by sputtering, by use of the ZnS—$SiO_2$ based target, S of ZnS diffuses to a storage film caused by reiteration of rewriting the storage film and irradiating the storage film with a laser light, there is a drawback in that the performance of reiteration of rewriting is degraded.

As a result, development of a protective film without S progresses. As an example of a protective film without S, a $ZrO_2$—$In_2O_3$ based protective film for an optical storage medium has been proposed. The $ZrO_2$—$In_2O_3$ based protective film includes zirconium oxide and indium oxide as main components, and component compositions made of $Zr_aIn_bA_cO_{100-a-b-c}$ in which an oxidative product of the A ($SiO_2$, $Cr_2O_3$, $Al_2O_3$, $CeO_2$, $TiO_2$, $SnO_2$, or the like) is included, where "A" represents one, two, or more of Si, Cr, Al, Ce, Ti, and Sn, "a" represents an amount greater than 5 atomic percent and less than 23 atomic percent, "b" represents an amount greater than 12 atomic percent and less than 35 atomic percent, and "c" represents an amount greater than 0 and less than 30 atomic percent.

It is also known that a $ZrO_2$—$In_2O_3$ based protective film for an optical storage medium can be formed by sputtering, by use of a $ZrO_2$—$In_2O_3$ based target having substantially the same component compositions as the component compositions of the protective film.

The foregoing technique has been disclosed in, for example, Japanese Unexamined Patent Application, First Publication No. 2005-56545.

In the conventional method for forming a sputtering target for forming a $ZrO_2$—$In_2O_3$ based protective film for an optical storage medium, zirconium oxide powders, indium oxide powders, and powders of the oxidative product of the A which serve as raw material powders, are prepared. The raw material powders are compound and blended with a predetermined percentage, and mixed powders are produced. The mixed powders are baked in an air atmosphere or in an oxidized atmosphere such as an oxygen atmosphere after the mixed powders are produced.

In a conventional target formed in this manner, the large amount of Zr that is included in the conventional target used for forming a $ZrO_2$—$In_2O_3$ based protective film for an optical storage medium is a zirconium oxide phase.

The other are compositions made of a indium oxide phase and an oxidative product phase of the A.

However, in the case where a high output sputtering is performed by use of the target used for forming the $ZrO_2$—$In_2O_3$ based protective film for an optical storage medium, and the large amount of Zr is a zirconium oxide phase and the other compositions are made of an indium oxide phase and the oxidative product phase of the A in the target, there is a problem in that, a crack is generated in the target during the sputtering, and it is impossible to efficiency form the protective film used for an optical storage medium.

SUMMARY OF THE INVENTION

The invention has an object to provide a target for forming a $ZrO_2$—$In_2O_3$ based protective film for an optical storage medium, having excellent resistance to cracking, in which a crack is not generated even if a sputtering is performed with a high output.

The inventors have researched a target used for forming a protective film for an optical storage medium in order to produce the target, the target having excellent resistance to cracking, in which a crack is not generated in a sputtering even if a high output sputtering is performed. As a result, according to their findings, study conclusions as described below were obtained:

(a) even if a high speed sputtering is performed, a crack is not generated in a target used for forming a $ZrO_2$—$In_2O_3$ based protective film for an optical storage medium, the target has compositions in which 90% (preferably 100%) or more of Zr that is included in the target is in an oxidative product phase in which Zr and In are combined, and is dispersed in a base material of the target; and (b) the oxidative product phase in which Zr and In are combined has a component composition made of $Zr_xIn_yO_{100-x-y}$ where "x" represents an amount greater than 20 atomic percent and less than 30 atomic percent, and "y" represents an amount greater than 10 atomic percent and less than 16 atomic percent.

The invention was made with respect to the above-described study conclusions, and provides (1) a sputtering target for forming a $ZrO_2$—$In_2O_3$ based protective film for an optical storage medium, having excellent resistance to cracking, and having a component composition made of $Zr_aIn_bA_cO_{100-a-b-c}$ where "A" represents one, two, or more of Si, Cr, Al, Ce, Ti, and Sn, "a" represents an amount greater than 5 atomic percent and less than 23 atomic percent, "b" represents an amount greater than 12 atomic percent and less than 35 atomic percent, and "c" represents an amount greater than 0 and less than 30 atomic percent, wherein 90% or more of Zr that is included in the sputtering target for forming the protective film for the optical storage medium is in an oxidative product phase in which Zr and In are combined, and is dispersed in a base material of the target.

In addition, the invention provides (2) the a sputtering target for forming a $ZrO_2$—$In_2O_3$ based protective film for an optical storage medium, having excellent resistance to cracking, according to above-described (1), wherein the oxidative product phase in which Zr and In are combined has a component composition made of $Zr_xIn_yO_{100-x-y}$ where "x" represents an amount greater than 20 atomic percent and less than 30 atomic percent, and "y" represents an amount is greater than 10 atomic percent and less than 16 atomic percent.

In order to manufacture the sputtering target for forming a $ZrO_2$—$In_2O_3$ based protective film for an optical storage medium of the invention, having excellent resistance to cracking, zirconium oxide powders and indium oxide powders which serves as raw material powders are prepared, furthermore, powders of the oxidative product of the A (silicon dioxide powders, aluminum oxide powders, titanium oxide powders, tin oxide powders, cerium oxide powders, chrome oxide powders, or the like) are prepared.

The zirconium oxide powders and the indium oxide powders are mixed and molded, thereafter, a baked body is formed by baking. By pulverizing the baked body, powders made of an oxidative product in which Zr and In are combined are produced.

The powders of the oxidative product of the A and the indium oxide powders which have been prepared in advance are blended into the powders made of an oxidative product in which Zr and In are combined and mixed powders are made.

Consequently, by pressing and shaping the mixed powders, a molded body is obtained, and the molded body is sintered in an oxygen atmosphere or in an air atmosphere.

In the foregoing processes, it is possible to produce the sputtering target of the invention, having excellent resistance to cracking, for forming a $ZrO_2$—$In_2O_3$ based protective film for an optical storage medium.

The sputtering target of the invention for forming a $ZrO_2$—$In_2O_3$ based protective film for an optical storage medium has excellent resistance to cracking and is produced in the above-described manner. 90% or more of the Zr that is included in the sputtering target is in an oxidative product phase in which Zr and In are combined, and is dispersed in a base material.

In the sputtering target for forming a $ZrO_2$—$In_2O_3$ based protective film for an optical storage medium, the more percentage of Zr that is included in the target in which Zr serves as the oxidative product phase in which Zr and In are combined and is dispersed in a base material, the more generation of cracks are reduced, even if a high speed sputtering is performed.

Therefore, in the sputtering target for forming a $ZrO_2$—$In_2O_3$ based protective film for an optical storage medium, the more percentage of Zr that is included in the sputtering target in which Zr serves as the oxidative product phase in which Zr and In are combined and is dispersed in a base material, the more preferable it is. It is most preferable that 100% of Zr which serves as the oxidative product phase in which Zr and In are combined be dispersed in a base material.

Consequently, the oxidative product phase in which Zr and In are combined has a component composition made of $Zr_x In_y O_{100-x-y}$, where "x" represents an amount greater than 20 atomic percent and less than 30 atomic percent, and "y" represents an amount greater than 10 atomic percent and less than 16 atomic percent.

In the target of the invention used for forming a $ZrO_2$—$In_2O_3$ based protective film for an optical storage medium, even if a high output sputtering is performed, since a crack does not occur in the target, it is possible to form a $ZrO_2$—$In_2O_3$ based protective film for an optical storage medium with a further improved efficiency.

DESCRIPTION OF THE PREFERRED EMBODIMENTS

Subsequently, an example of a target of the invention used for forming a $ZrO_2$—$In_2O_3$ based protective film for an optical storage medium, having excellent resistance to cracking will be specifically described.

As raw material powders, $ZrO_2$ powders having an average particle diameter of 0.5 μm, and whose degree of purity is greater than or equal to 99.99%; $In_2O_3$ powders having an average particle diameter of 0.5 μm, and whose degree of purity is greater than or equal to 99.9%; $SiO_2$ powders having an average particle diameter of 0.2 μm, and whose degree of purity is greater than or equal to 99.99%; $Al_2O_3$ powders having an average particle diameter of 0.5 μm, and whose degree of purity is greater than or equal to 99.9%; $TiO_2$ powders having an average particle diameter of 0.2 μm, and whose degree of purity is greater than or equal to 99.99%; $CeO_2$ powders having an average particle diameter of 1 μm, and whose degree of purity is greater than or equal to 99.99%; $SnO_2$ powders having an average particle diameter of 1 μm, and whose degree of purity is greater than or equal to 99.99%; and $Cr_2O_3$ powders having an average particle diameter of 0.5 μm, and whose degree of purity is greater than or equal to 99.9% were prepared.

Firstly, $ZrO_2$ powders and $In_2O_3$ powders which have been prepared in advance were blended so as to obtain the percentage indicated in Table 1, the obtained blended powders were mixed by use of zirconia balls whose diameter is 1 mm, for 10 minutes and in a bead mill of a wet grinding apparatus, and mixed powders whose average particle diameter is 0.3 μm were produced.

Deionized water was used as dispersion liquid, the dispersion liquid in which pulverization was completed was heated up using a hot plate at 150° C., and the mixed powders were dried.

The mixed powders that were dried in this manner were baked in the condition indicated in Table 1; thereafter, the mixed powders were pulverized, and powders A to F made of oxidative products in which Zr and In are combined were produced. The powders A to F include component composition of $Zr_x In_y O_{100-x-y}$ having "x" and "y" indicated in Table 1.

TABLE 1

| | | COMPONENT COMPOSITION OF RAW MATERIAL POWDERS (MOL %) | | | | | MEASURED COMPONENT COMPOSITION OF POWERED OXIDATIVE PRODUCT IN WHICH Zr AND In ARE COMBINED, BY USE OF EPMA $Zr_x In_y O_{100-x-y}$ (ATOM %) | |
|---|---|---|---|---|---|---|---|---|
| TYPE | | $ZrO_2$ | $In_2O_3$ | ATMOSPHERE | TEMPERATURE (° C.) | TIME (H) | x | y |
| POWDERED OXIDATIVE | A | 82 | REMNANT | OXYGEN | 1450 | 3 | 21.3 | 14.7 |
| | B | 80 | REMNANT | OXYGEN | 1450 | 4 | 23.9 | 13.4 |

TABLE 1-continued

| TYPE | | COMPONENT COMPOSITION OF RAW MATERIAL POWDERS (MOL %) | | BAKING CONDITIONS | | | MEASURED COMPONENT COMPOSITION OF POWERED OXIDATIVE PRODUCT IN WHICH Zr AND In ARE COMBINED, BY USE OF EPMA $Zr_xIn_yO_{100-x-y}$ (ATOM %) | |
|---|---|---|---|---|---|---|---|---|
| | | $ZrO_2$ | $In_2O_3$ | ATMOSPHERE | TEMPERATURE (° C.) | TIME (H) | x | y |
| PRODUCT IN WHICH Zr AND In ARE COMBINED | C | 81 | REMNANT | OXYGEN | 1450 | 5 | 24.6 | 12.9 |
| | D | 49 | REMNANT | OXYGEN | 1450 | 3 | 26.7 | 14.2 |
| | E | 80 | REMNANT | OXYGEN | 1450 | 3 | 27.4 | 13.4 |
| | F | 78 | REMNANT | OXYGEN | 1450 | 5 | 29.0 | 14.5 |

Example 1

$SiO_2$ powders and $In_2O_3$ powders which had been prepared in advance were added to the powders A to F which were made of oxidative products in which Zr and In are combined, and which had been prepared in advance as indicated in Table 1, so as to obtain the percentage indicated in Table 2; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 2, a baked body was produced by baking the molded body; furthermore, a surface of the baked body was machined by mechanical working, and targets 1 to 9 of the invention having a diameter of 125 mm and a thickness of 6 mm and having component compositions as indicated in Table 2 were thereby produced.

The percentage of Zr, as an oxidative product in which Zr and In are combined, that is included in the targets 1 to 9 of the invention and that is dispersed in a base material, is measured by use of EPMA (JXA-8500F, JEOL Ltd.) in a below-described manner.

Firstly, by use of the EPMA and by capture of a Backscattered Electron Image, a composition of a polished cross-sectional face of the target in an area of 5000 µm² or more was captured with a magnification ratio of 3000 or more.

Furthermore, by use of a WDS (Wavelength-Dispersive Spectrometer) technique, a phase including Zr and a phase simultaneously including Zr and In are determined. An area of the phase including only Zr and an area of the phase made of the oxidative product in which Zr and In are combined are calculated based on the captured image. The percentage of Zr that is included in the target and is in the oxidative product in which Zr and In are combined is determined, and the result thereof is indicated in Table 2.

Conventional Example 1

$ZrO_2$ powders, $In_2O_3$ powders, and $SiO_2$ powders which have been prepared as raw material powders in advance were mixed together so as to obtain the percentage indicated in Table 2; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 2, a baked body was produced by baking the molded body; furthermore, a surface of the baked body was machined by mechanical working, and a conventional target 1 having a diameter of 125 mm and a thickness of 6 mm and having component compositions as indicated in Table 2 were thereby produced.

The percentage of Zr, as an oxidative product in which Zr and In are combined, that is included in the conventional target 1, and that is dispersed in a base material, is measured by use of EPMA (JXA-8500F, JEOL Ltd.) in a below-described manner.

Firstly, by use of the EPMA and by capture of a Backscattered Electron Image, a composition of a polished cross-sectional face of the target in an area of 5000 µm² or more was captured with a magnification ratio of 3000 or more.

Furthermore, by use of a WDS (Wavelength-Dispersive Spectrometer) technique, a phase including Zr and a phase simultaneously including Zr and In are determined. An area of the phase including only Zr and an area of the phase made of the oxidative product in which Zr and In are combined are calculated based on the captured image. The percentage of Zr that is included in the target and is in the oxidative product in which Zr and In are combined is determined, and the result thereof is indicated in Table 2.

In a state where each of the targets 1 to 9 of the invention and conventional target 1 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1 \times 10^{-6}$ Torr; thereafter, the inside of the apparatus is set to a gas partial pressure of 10 mTorr of Ar in an atmosphere by supplying Ar gas into the apparatus.

By use of the targets 1 to 9 of the invention and the conventional target 1 in the above-described conditions, a sputtering is performed for 3 minutes by applying 2 kW greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 2.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 3, a baked body was produced by baking the molded body; furthermore, a surface of the baked body was machined by mechanical working, and targets 10 to 18 of the invention having a diameter of 125 mm and a thickness of 6 mm and having component compositions as indicated in Table 3 were thereby produced.

The percentage of Zr that is included in the targets 10 to 18 of the invention as the oxidative product phase in which Zr

TABLE 2

| TARGET | | COMPONENT COMPOSITION OF RAW MATERIAL POWDERS (MOL %) | | | BAKING CONDITIONS | | | COMPONENT COMPOSITION OF TARGET (ATOM %) $Zr_aIn_bSi_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED (%) | EXISTENCE OF CRACK IN TARGET USED IN SPUTTERING |
|---|---|---|---|---|---|---|---|---|---|---|---|---|
| | | POWDERED OXIDATIVE PRODUCT IN WHICH Zr AND In ARE COMBINED SHOWN IN TABLE 1 | $In_2O_3$ | $SiO_2$ | AT-MOS-PHERE | TEM-PERA-TURE (°C.) | TIME (H) | a | b | c | | |
| INVENTION | 1 | A: 30 | 40 | REMNANT | AIR | 1400 | 4 | 6.3 | 23.2 | 7.7 | 99 | NONE |
| | 2 | A: 50 | 30 | | | | | 10.8 | 20.6 | 5.3 | 98 | NONE |
| | 3 | B: 40 | 30 | | | | | 8.5 | 20.2 | 8.0 | 98 | NONE |
| | 4 | C: 25 | 35 | | | | | 5.3 | 20.9 | 10.5 | 98 | NONE |
| | 5 | C: 70 | 20 | | | | | 15.5 | 18.2 | 2.7 | 97 | NONE |
| | 6 | D: 70 | 30 | | | | | 14.2 | 23.0 | 2.7 | 96 | NONE |
| | 7 | E: 40 | 60 | | | | | 7.3 | 31.2 | 5.1 | 98 | NONE |
| | 8 | E: 30 | 70 | | | | | 5.3 | 33.6 | 5.5 | 99 | NONE |
| | 9 | F: 90 | 5 | | | | | 20.0 | 14.2 | 1.4 | 95 | NONE |
| CONVEN-TIONAL | 1 | $ZrO_2$: 50, $In_2O_3$: 30 | | | | | | 13.9 | 16.7 | 5.5 | 70 | EXISTING |

Based on the result indicated in Table 2, in the targets 1 to 9 of the invention, 90% or more of Zr as the oxidative product phase in which Zr and In are combined is dispersed in a base material. In the conventional target 1, an amount of Zr that is less than 90%, which serves as the oxidative product phase in which Zr and In are combined, is dispersed in the base material.

Compared with the conventional target 1 having compositions in which a $ZrO_2$ phase exists in large numbers, it is seen that a crack is not generated in a high output sputtering in the targets 1 to 9 of the invention.

Example 2

$Al_2O_3$ powders and $In_2O_3$ powders which had been prepared in advance were added to the powders A to F which were made of oxidative products in which Zr and In are combined, and which had been prepared in advance as indicated in Table 1, so as to obtain the percentage indicated in Table 3; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

and In are combined and that is dispersed in a base material is determined in a manner similar to the Example 1, and the result thereof is indicated in Table 3.

Conventional Example 2

$ZrO_2$ powders, $In_2O_3$ powders, and $Al_2O_3$ powders which have been prepared as as raw material powders in advance were mixed together so as to obtain the percentage indicated in Table 3; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 3, a baked body was produced by baking the molded body; furthermore, a surface of the baked body was machined by mechanical working, and a conventional target 2 having a diameter of 125 mm and a thickness of 6 mm and having component compositions as indicated in Table 3 were thereby produced.

The percentage of Zr that is included in the conventional target 2 as the oxidative product phase in which Zr and In are combined and that is dispersed in a base material is determined in a manner similar to the Conventional Example 1, and the result thereof is indicated in Table 3.

In a state where each of the targets 10 to 18 of the invention and conventional target 2 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1 \times 10^{-6}$ Torr; thereafter, the inside of the apparatus is set to a gas partial pressure of 10 mTorr of Ar in an atmosphere by supplying Ar gas into the apparatus.

By use of the targets 10 to 18 of the invention and the conventional target 2 in the above-described conditions, a sputtering is performed for 3 minutes by applying 2 kW greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 3.

that a crack is not generated in a high output sputtering in the targets 10 to 18 of the invention.

Example 3

$TiO_2$ powders and $In_2O_3$ powders which had been prepared in advance were added to the powders A to F which were made of oxidative products in which Zr and In are combined, and which had been prepared in advance as indicated in Table 1, so as to obtain the percentage indicated in Table 4; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 4, a baked body was produced by baking the molded body; furthermore, a surface of the baked body was machined by mechanical working, and targets 19 to 27 of the invention having a diameter of 125 mm and a thickness of 6 mm and having component compositions as indicated in Table 4 were thereby produced.

TABLE 3

| TARGET | | COMPONENT COMPOSITION OF RAW MATERIAL POWDERS (MOL %) | | | BAKING CONDITIONS | | | COMPONENT COMPOSITION OF TARGET (ATOM %) $Zr_aIn_bAl_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED | EXISTENCE OF CRACK IN TARGET USED IN |
|---|---|---|---|---|---|---|---|---|---|---|---|---|
| | | POWDERED OXIDATIVE PRODUCT IN WHICH Zr AND In ARE COMBINED SHOWN IN TABLE 1 | $In_2O_3$ | $Al_2O_3$ | AT-MOS-PHERE | TEM-PERA-TURE (° C.) | TIME (H) | a | b | c | (%) | SPUTTERING |
| INVENTION | 10 | A: 30 | 40 | REMNANT | AIR | 1400 | 4 | 5.4 | 20.1 | 13.3 | 99 | NONE |
| | 11 | A: 50 | 30 | REMNANT | | | | 9.8 | 18.6 | 9.5 | 99 | NONE |
| | 12 | B: 40 | 30 | REMNANT | | | | 7.3 | 17.4 | 13.8 | 98 | NONE |
| | 13 | C: 40 | 20 | REMNANT | | | | 7.4 | 12.7 | 18.4 | 98 | NONE |
| | 14 | C: 70 | 20 | REMNANT | | | | 14.7 | 17.2 | 5.2 | 97 | NONE |
| | 15 | D: 70 | 20 | REMNANT | | | | 14.2 | 17.8 | 5.1 | 97 | NONE |
| | 16 | E: 40 | 40 | REMNANT | | | | 7.3 | 22.0 | 9.2 | 97 | NONE |
| | 17 | E: 60 | 20 | REMNANT | | | | 11.9 | 15.8 | 9.9 | 98 | NONE |
| | 18 | F: 90 | 5 | REMNANT | | | | 19.5 | 13.8 | 2.8 | 94 | NONE |
| CONVENTIONAL 2 | | $ZrO_2$: 50, $In_2O_3$: 30 | | REMNANT | | | | 12.5 | 15.0 | 10.0 | 70 | EXISTING |

Based on the result indicated in Table 3, in the targets 10 to 18 of the invention, 90% or more of Zr as the oxidative product phase in which Zr and In are combined is dispersed in a base material. In the conventional target 2, an amount of Zr that is less than 90%, which serves as the oxidative product phase in which Zr and In are combined, is dispersed in the base material.

Compared with the conventional target 2 having compositions in which a $ZrO_2$ phase exists in large numbers, it is seen The percentage of Zr that is included in the targets 19 to 27 of the invention as the oxidative product phase in which Zr and In are combined and that is dispersed in a base material is determined in a manner similar to the Example 1, and the result thereof is indicated in Table 4.

Conventional Example 3

$ZrO_2$ powders, $In_2O_3$ powders, and $TiO_2$ powders which have been prepared as raw material powders in advance were mixed together so as to obtain the percentage indicated in Table 4; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 4.

TABLE 4

| TARGET | COMPONENT COMPOSITION OF RAW MATERIAL POWDERS (MOL %) | | | BAKING CONDITIONS | | | COMPONENT COMPOSITION OF TARGET (ATOM %) $Zr_aIn_bTi_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED | EXISTENCE OF CRACK IN TARGET USED IN SPUTTERING |
|---|---|---|---|---|---|---|---|---|---|---|---|
| | POWDERED OXIDATIVE PRODUCT IN WHICH Zr AND In ARE COMBINED SHOWN IN TABLE 1 | $In_2O_3$ | $TiO_2$ | AT-MOS-PHERE | TEM-PERA-TURE (° C.) | TIME (H) | a | b | c | (%) | |
| INVENTION 19 | A: 30 | 40 | REMNANT | AIR | 1400 | 4 | 6.3 | 23.2 | 7.7 | 98 | NONE |
| 20 | A: 50 | 30 | REMNANT | | | | 10.8 | 20.6 | 5.3 | 97 | NONE |
| 21 | B: 40 | 30 | REMNANT | | | | 8.5 | 20.2 | 8.0 | 98 | NONE |
| 22 | C: 25 | 35 | REMNANT | | | | 5.3 | 20.9 | 5.0 | 98 | NONE |
| 23 | C: 70 | 20 | REMNANT | | | | 15.5 | 18.2 | 2.7 | 97 | NONE |
| 24 | D: 70 | 20 | REMNANT | | | | 15.0 | 18.8 | 2.7 | 96 | NONE |
| 25 | E: 40 | 40 | REMNANT | | | | 8.1 | 24.2 | 5.1 | 98 | NONE |
| 26 | E: 60 | 20 | REMNANT | | | | 13.2 | 17.6 | 5.5 | 99 | NONE |
| 27 | F: 90 | 5 | REMNANT | | | | 20.0 | 14.2 | 1.4 | 94 | NONE |
| CONVENTIONAL 3 | $ZrO_2$: 50, $In_2O_3$: 30 | | REMNANT | | | | 13.9 | 16.7 | 5.5 | 60 | EXISTING |

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 4, a baked body was produced by baking the molded body; furthermore, a surface of the baked body was machined by mechanical working, and a conventional target 3 having a diameter of 125 mm and a thickness of 6 mm and having component compositions as indicated in Table 4 were thereby produced.

The percentage of Zr that is included in the conventional target 3 as the oxidative product phase in which Zr and In are combined and that is dispersed in a base material is determined in a manner similar to the Conventional Example 1, and the result thereof is indicated in Table 4.

In a state where each of the targets 19 to 27 of the invention and conventional target 3 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1\times10^{-6}$ Torr; thereafter, the inside of the apparatus is set to a gas partial pressure of 10 mTorr of Ar in an atmosphere by supplying Ar gas into the apparatus.

By use of the targets 19 to 27 of the invention and the conventional target 3 in the above-described conditions, a sputtering is performed for 3 minutes by applying 2 kW Based on the result indicated in Table 4, in the targets 19 to 27 of the invention, 90% or more of Zr as the oxidative product phase in which Zr and In are combined is dispersed in a base material. In the conventional target 3, an amount of Zr that is less than 90%, which serves as the oxidative product phase in which Zr and In are combined, is dispersed in the base material.

Compared with the conventional target 3 having compositions in which a $ZrO_2$ phase exists in large numbers, it is seen that a crack is not generated in a high output sputtering in the targets 19 to 27 of the invention.

Example 4

$CeO_2$ powders and $In_2O_3$ powders which had been prepared in advance were added to the powders A to F which were made of oxidative products in which Zr and In are combined, and which had been prepared in advance as indicated in Table 1, so as to obtain the percentage indicated in Table 5; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 5, a baked body was produced by baking the molded body; furthermore, a surface of the baked body was machined by mechanical working, and targets 28 to 36 of the invention having a diameter of 125 mm and a thickness of 6 mm and having component compositions as indicated in Table 5 were thereby produced.

The percentage of Zr that is included in the targets 28 to 36 of the invention as the oxidative product phase in which Zr and In are combined and that is dispersed in a base material is determined in a manner similar to the Example 1, and the result thereof is indicated in Table 5.

Conventional Example 4

$ZrO_2$ powders, $In_2O_3$ powders, and $CeO_2$ powders which have been prepared as raw material powders in advance were mixed together so as to obtain the percentage indicated in Table 5; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 5, a baked body was produced by baking the molded body; furthermore, a surface of the baked body was machined by mechanical working, and a conventional target 4 having a diameter of 125 mm and a thickness of 6 mm and having component compositions as indicated in Table 5 were thereby produced.

The percentage of Zr that is included in the conventional target 4 as the oxidative product phase in which Zr and In are combined and that is dispersed in a base material is determined in a manner similar to the Conventional Example 1, and the result thereof is indicated in Table 5.

In a state where each of the targets 28 to 36 of the invention and conventional target 4 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1 \times 10^{-6}$ Torr; thereafter, the inside of the apparatus is set to a gas partial pressure of 10 mTorr of Ar in an atmosphere by supplying Ar gas into the apparatus.

By use of the targets 28 to 36 of the invention and the conventional target 4 in the above-described conditions, a sputtering is performed for 3 minutes by applying 2 kW greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 5.

TABLE 5

| | | COMPONENT COMPOSITION OF RAW MATERIAL POWDERS (MOL %) | | | BAKING CONDITIONS | | | COMPONENT COMPOSITION OF TARGET (ATOM %) | | | PERCENTAGE OF Zr THAT IS INCLUDED IN TARGET AND THAT SERVES AS OXIDATIVE PRODUCT IN WHICH Zr AND In ARE COMBINED | EXISTENCE OF CRACK IN TARGET USED IN |
|---|---|---|---|---|---|---|---|---|---|---|---|---|
| | | POWDERED OXIDATIVE PRODUCT IN WHICH Zr AND In ARE COMBINED SHOWN IN TABLE 1 | $In_2O_3$ | $CeO_2$ | ATMOSPHERE | TEMPERATURE (° C.) | TIME (H) | $Zr_a In_b Ce_c O_{100-a-b-c}$ | | | | |
| TARGET | | | | | | | | a | b | c | (%) | SPUTTERING |
| INVENTION | 28 | A: 30 | 40 | REMNANT | AIR | 1400 | 4 | 6.3 | 23.2 | 7.7 | 99 | NONE |
| | 29 | A: 50 | 30 | REMNANT | | | | 10.8 | 20.6 | 5.3 | 97 | NONE |
| | 30 | B: 40 | 30 | REMNANT | | | | 8.5 | 20.2 | 8.0 | 98 | NONE |
| | 31 | C: 25 | 35 | REMNANT | | | | 5.3 | 20.9 | 10.5 | 97 | NONE |
| | 32 | C: 70 | 20 | REMNANT | | | | 15.5 | 18.2 | 2.7 | 96 | NONE |
| | 33 | D: 70 | 20 | REMNANT | | | | 15.0 | 18.8 | 2.7 | 96 | NONE |
| | 34 | E: 40 | 40 | REMNANT | | | | 8.1 | 24.2 | 5.1 | 96 | NONE |
| | 35 | E: 60 | 20 | REMNANT | | | | 13.2 | 17.6 | 5.5 | 98 | NONE |
| | 36 | F: 90 | 5 | REMNANT | | | | 20.0 | 14.2 | 1.4 | 95 | NONE |
| CONVENTIONAL 4 | | $ZrO_2$: 50, $In_2O_3$: 30 | | REMNANT | | | | 13.9 | 16.7 | 5.5 | 65 | EXISTING |

Based on the result indicated in Table 5, in the targets 28 to 36 of the invention, 90% or more of Zr as the oxidative product phase in which Zr and In are combined is dispersed in a base material. In the conventional target 4, an amount of Zr that is less than 90%, which serves as the oxidative product phase in which Zr and In are combined, is dispersed in the base material.

Compared with the conventional target 4 having compositions in which a $ZrO_2$ phase exists in large numbers, it is seen that a crack is not generated in a high output sputtering in the targets 28 to 36 of the invention.

Example 5

SnO$_2$ powders and In$_2$O$_3$ powders which had been prepared in advance were added to the powders A to F which were made of oxidative products in which Zr and In are combined, and which had been prepared in advance as indicated in Table 1, so as to obtain the percentage indicated in Table 6; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 6, a baked body was produced by baking the molded body; furthermore, a surface of the baked body was machined by mechanical working, and targets 37 to 45 of the invention having a diameter of 125 mm and a thickness of 6 mm and having component compositions as indicated in Table 6 were thereby produced.

The percentage of Zr that is included in the targets 37 to 45 of the invention as the oxidative product phase in which Zr and In are combined and that is dispersed in a base material is determined in a manner similar to the Example 1, and the result thereof is indicated in Table 6.

Conventional Example 5

ZrO$_2$ powders, In$_2$O$_3$ powders, and SnO$_2$ powders which have been prepared as raw material powders in advance were mixed together so as to obtain the percentage indicated in Table 6; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 6, a baked body was produced by baking the molded body; furthermore, a surface of the baked body was machined by mechanical working, and a conventional target 5 having a diameter of 125 mm and a thickness of 6 mm and having component compositions as indicated in Table 6 were thereby produced.

The percentage of Zr that is included in the conventional target 5 as the oxidative product phase in which Zr and In are combined and that is dispersed in a base material is determined in a manner similar to the Conventional Example 1, and the result thereof is indicated in Table 6.

In a state where each of the targets 37 to 45 of the invention and conventional target 5 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1\times10^{-6}$ Torr; thereafter, the inside of the apparatus is set to a gas partial pressure of 10 mTorr of Ar in an atmosphere by supplying Ar gas into the apparatus.

By use of the targets 37 to 45 of the invention and the conventional target 5 in the above-described conditions, a sputtering is performed for 3 minutes by applying 2 kW greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 6.

TABLE 6

| TARGET | | COMPONENT COMPOSITION OF RAW MATERIAL POWDERS (MOL %) | | | BAKING CONDITIONS | | | COMPONENT COMPOSITION OF TARGET (ATOM %) $Zr_aIn_bSn_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED | EXISTENCE OF CRACK IN TARGET USED IN SPUTTERING |
|---|---|---|---|---|---|---|---|---|---|---|---|---|
| | | POWDERED OXIDATIVE PRODUCT IN WHICH Zr AND In ARE COMBINED SHOWN IN TABLE 1 | In$_2$O$_3$ | SnO$_2$ | AT-MOS-PHERE | TEM-PERA-TURE (° C.) | TIME (H) | a | b | c | (%) | |
| INVENTION | 37 | A: 30 | 40 | REMNANT | OXY-GEN | 1400 | 4 | 6.5 | 24.2 | 6.5 | 98 | NONE |
| | 38 | A: 50 | 30 | REMNANT | | | | 11.0 | 21.0 | 4.7 | 98 | NONE |
| | 39 | B: 40 | 30 | REMNANT | | | | 8.5 | 20.2 | 7.8 | 97 | NONE |
| | 40 | C: 25 | 35 | REMNANT | | | | 5.5 | 21.0 | 10.0 | 98 | NONE |
| | 41 | C: 70 | 20 | REMNANT | | | | 15.9 | 18.2 | 3.1 | 97 | NONE |
| | 42 | D: 70 | 20 | REMNANT | | | | 15.0 | 18.8 | 2.7 | 96 | NONE |
| | 43 | E: 40 | 40 | REMNANT | | | | 8.3 | 24.5 | 4.5 | 99 | NONE |
| | 44 | E: 30 | 20 | REMNANT | | | | 13.1 | 17.6 | 5.6 | 98 | NONE |
| | 45 | F: 90 | 5 | REMNANT | | | | 20.0 | 14.7 | 0.9 | 94 | NONE |

TABLE 6-continued

| | COMPONENT COMPOSITION OF RAW MATERIAL POWDERS (MOL %) | | | BAKING CONDITIONS | | | COMPONENT COMPOSITION OF TARGET (ATOM %) $Zr_aIn_bSn_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED | EXISTENCE |
|---|---|---|---|---|---|---|---|---|---|---|---|
| | POWDERED OXIDATIVE PRODUCT IN WHICH Zr AND In ARE COMBINED SHOWN IN | | | | TEM- | | | | | | |
| TARGET | TABLE 1 | $In_2O_3$ | $SnO_2$ | AT-MOS-PHERE | PERA-TURE (° C.) | TIME (H) | a | b | c | (%) | OF CRACK IN TARGET USED IN SPUTTERING |
| CONVEN-TIONAL 5 | $ZrO_2$: 50, $In_2O_3$: 30 | | REMNANT | | | | 14.1 | 16.9 | 5.1 | 78 | EXISTING |

Based on the result indicated in Table 6, in the targets 37 to 45 of the invention, 90% or more of Zr as the oxidative product phase in which Zr and In are combined is dispersed in a base material. In the conventional target 5, an amount of Zr that is less than 90%, which serves as the oxidative product phase in which Zr and In are combined, is dispersed in the base material.

Compared with the conventional target 5 having compositions in which a $ZrO_2$ phase exists in large numbers, it is seen that a crack is not generated in a high output sputtering in the targets 37 to 45 of the invention.

Example 6

$Cr_2O_3$ powders and $In_2O_3$ powders which had been prepared in advance were added to the powders A to F which were made of oxidative products in which Zr and In are combined, and which had been prepared in advance as indicated in Table 1, so as to obtain the percentage indicated in Table 7; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 7, a baked body was produced by baking the molded body; furthermore, a surface of the baked body was machined by mechanical working, and targets 46 to 54 of the invention having a diameter of 125 mm and a thickness of 6 mm and having component compositions as indicated in Table 7 were thereby produced.

The percentage of Zr that is included in the targets 46 to 54 of the invention as the oxidative product phase in which Zr and In are combined and that is dispersed in a base material is determined in a manner similar to the Example 1, and the result thereof is indicated in Table 7.

Conventional Example 6

$ZrO_2$ powders, $In_2O_3$ powders, and $Cr_2O_3$ powders which have been prepared as raw material powders in advance were mixed together so as to obtain the percentage indicated in Table 7; furthermore, zirconia balls having a diameter of 1 mm and the dispersion liquid which serves as deionized water were added thereto and were mixed for 10 minutes in a bead mill of a wet grinding apparatus; and mixed powders were produced.

The obtained mixed powders were dried using a hot plate that was heated at 150° C., and moisture was thereby removed.

By use of a cold isostatic pressing method (CIP method), a molded body having a diameter of 200 mm and a thickness of 10 mm was produced from the mixed powders from which moisture had been removed by drying in the above-described manner.

Consequently, under the conditions indicated in Table 7, a baked body was produced by baking the molded body; furthermore, a surface of the baked body was machined by mechanical working, and a conventional target 6 having a diameter of 125 mm and a thickness of 6 mm and having component compositions as indicated in Table 7 were thereby produced.

The percentage of Zr that is included in the conventional target 6 as the oxidative product phase in which Zr and In are combined and that is dispersed in a base material is determined in a manner similar to the Conventional Example 1, and the result thereof is indicated in Table 7.

In a state where each of the targets 46 to 54 of the invention and conventional target 6 which are obtained in the above-described manner is solder-mounted to a water-cooling backing plate made of oxygen-free copper, the target is attached to a sputtering apparatus, the inside of the apparatus is evacuated by use of a vacuum evacuation device so as to be less than or equal to $1 \times 10^{-6}$ Torr; thereafter, the inside of the apparatus is set to a gas partial pressure of 10 mTorr of Ar in an atmosphere by supplying Ar gas into the apparatus.

By use of the targets 46 to 54 of the invention and the conventional target 6 in the above-described conditions, a sputtering is performed for 3 minutes by applying 2 kW greater than normal of sputtering power by use of an RF power source; thereafter, the sputtering is stopped for 1 minute.

The foregoing operation in which the sputtering is stopped for 1 minute after the sputtering for 3 minutes was repeated at 10 times.

Subsequently, the target is removed from the sputtering apparatus, the target is observed and it is determined whether or not a crack has been generated in the target, and the results of which are indicated in Table 7.

TABLE 7

| TARGET | | COMPONENT COMPOSITION OF RAW MATERIAL POWDERS (MOL %) | | | BAKING CONDITIONS | | | COMPONENT COMPOSITION OF TARGET (ATOM %) $Zr_aIn_bCr_cO_{100-a-b-c}$ | | | PERCENTAGE OF Zr THAT IS INCLUDED IN TARGET AND THAT SERVES AS OXIDATIVE PRODUCT IN WHICH Zr AND In ARE COMBINED (%) | EXISTENCE OF CRACK IN TARGET USED IN SPUTTERING |
|---|---|---|---|---|---|---|---|---|---|---|---|---|
| | | POWDERED OXIDATIVE PRODUCT IN WHICH Zr AND In ARE COMBINED SHOWN IN TABLE 1 | $In_2O_3$ | $Cr_2O_3$ | ATMOSPHERE | TEMPERATURE (° C.) | TIME (H) | a | b | c | | |
| INVENTION | 46 | A: 30 | 40 | REMNANT | AIR | 1400 | 4 | 5.6 | 20.2 | 13.0 | 99 | NONE |
| | 47 | A: 50 | 30 | REMNANT | | | | 9.9 | 18.9 | 9.1 | 99 | NONE |
| | 48 | B: 40 | 30 | REMNANT | | | | 7.3 | 17.5 | 13.6 | 99 | NONE |
| | 49 | C: 40 | 20 | REMNANT | | | | 7.4 | 12.9 | 18.0 | 98 | NONE |
| | 50 | C: 70 | 20 | REMNANT | | | | 14.7 | 17.2 | 5.2 | 97 | NONE |
| | 51 | D: 70 | 20 | REMNANT | | | | 14.2 | 17.8 | 5.1 | 97 | NONE |
| | 52 | E: 40 | 40 | REMNANT | | | | 7.5 | 22.2 | 8.8 | 98 | NONE |
| | 53 | E: 60 | 20 | REMNANT | | | | 12.0 | 15.9 | 9.7 | 99 | NONE |
| | 54 | F: 90 | 5 | REMNANT | | | | 19.5 | 13.8 | 2.8 | 96 | NONE |
| CONVENTIONAL 6 | | $ZrO_2$: 50, $In_2O_3$: | | REMNANT | | | | 12.7 | 9.5 | 9.5 | 70 | EXISTING |

Based on the result indicated in Table 7, in the targets 46 to 54 of the invention, 90% or more of Zr as the oxidative product phase in which Zr and In are combined is dispersed in a base material. In the conventional target 6, an amount of Zr that is less than 90%, which serves as the oxidative product phase in which Zr and In are combined, is dispersed in the base material.

Compared with the conventional target 6 having compositions in which a $ZrO_2$ phase exists in large numbers, it is seen that a crack is not generated in a high output sputtering in the targets 46 to 54 of the invention.

What is claimed is:

1. A sputtering target for forming a $ZrO_2$—$In_2O_3$ based protective film for an optical storage medium, having excellent resistance to cracking, and having a component composition made of $Zr_aIn_bA_cO_{100-a-b-c}$ where "A" represents one, two, or more selected from the group consisting of Si, Cr, Al, Ce, Ti, and Sn, "a" represents an amount greater than 5 atomic percent and less than 23 atomic percent, "b" represents an amount greater than 12 atomic percent and less than 35 atomic percent, and "c" represents an amount greater than 0 and less than 30 atomic percent, wherein 90% or more of Zr that is included in the sputtering target for forming the protective film for the optical storage medium is in an oxidative product phase in which Zr and In are combined, and is dispersed in a base material of the target.

2. The sputtering target for forming a $ZrO_2$—$In_2O_3$ based protective film for an optical storage medium according to claim 1, wherein the oxidative product phase in which Zr and In are combined has a component composition made of $Zr_xIn_yO_{100-x-y}$ where "x" represents an amount greater than 20 atomic percent and less than 30 atomic percent, and "y" represents an amount greater than 10 atomic percent and less than 16 atomic percent.

* * * * *